(12) United States Patent
Lu et al.

(10) Patent No.: US 6,912,082 B1
(45) Date of Patent: Jun. 28, 2005

(54) INTEGRATED DRIVER ELECTRONICS FOR MEMS DEVICE USING HIGH VOLTAGE THIN FILM TRANSISTORS

(75) Inventors: JengPing Lu, San Jose, CA (US); Eugene M. Chow, Stanford, CA (US); Jackson H. Ho, Palo Alto, CA (US); Chinnwen Shih, Santa Clara, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 34 days.

(21) Appl. No.: 10/799,237

(22) Filed: Mar. 11, 2004

(51) Int. Cl.$^7$ .............................................. G02B 26/00
(52) U.S. Cl. ........................ 359/295; 359/290; 359/298; 359/223
(58) Field of Search ............................... 359/290–295, 359/298, 223–224

(56) References Cited

U.S. PATENT DOCUMENTS

| | | | |
|---|---|---|---|
| 3,842,189 A | | 10/1974 | Southgate |
| 5,613,861 A | | 3/1997 | Smith et al. |
| 5,903,246 A | * | 5/1999 | Dingwall ................... 345/82 |
| 5,952,789 A | * | 9/1999 | Stewart et al. ........... 315/169.4 |
| 6,307,681 B1 | * | 10/2001 | Aoki et al. ................. 359/645 |
| 6,787,384 B2 | * | 9/2004 | Okumura ..................... 438/53 |
| 2004/0042287 A1 | * | 3/2004 | Okumura .................... 365/200 |
| 2004/0135951 A1 | * | 7/2004 | Stumbo et al. ............. 349/139 |
| 2004/0209393 A1 | * | 10/2004 | Okumura ..................... 438/53 |

OTHER PUBLICATIONS

Fonash: "Integration Of Thin Film Electronics And MEMs", SPIE vol. 2722, 2/96, pp. 66–74.

Martin et al.: "High–Voltage Amorphous Silicon Thin–Film Transistors", IEEE Transactions On Electron Devices, vol. 40, No. 3, Mar. 1993, pp. 634–643.

Huang et al.: "Device Sensitivity Of Field–Plated Polysilicon High–Voltage TFT's And Their Application To Low-–Voltage Operation", IEEE Electron Device Letters, vol. 11, Nov. 1990, pp. 541–543.

Welsh et al.: "NCAP Displays: Optical Switching And Dielectric Properties", SID 90 Digest, 1990, pp. 220–223.

Chuang et al.: "Page–Wide High–Voltage Polysilicon TFT Array For Electronic Printing", SID 90 Digest, 1990, pp. 508–511.

* cited by examiner

*Primary Examiner*—Evelyn A. Lester
(74) *Attorney, Agent, or Firm*—Bever, Hoffman & Harms LLP; Patrick T. Bever

(57) ABSTRACT

An apparatus integrating electrostatically actuated MEMS devices and high voltage driver (actuator) electronics on a single substrate, where the driver electronics utilize offset-gate high voltage thin-film transistors (HVTFTs) that facilitate the transmission of high actuating voltages using relatively low control voltages, thereby facilitating the formation of large arrays of electrostatically-actuated MEMS devices. The driver circuit is arranged such that the high actuating voltage is applied to an actuating electrode of the actuated MEMS device and drain electrode of the HVTFT when the HVTFT is turned off, thereby minimizing dielectric breakdown. When the HVTFT is turned on in response to the relatively low control voltage, the high actuating voltage is discharged to ground from the drain (offset) electrode to the source (not offset) electrode.

20 Claims, 9 Drawing Sheets

FIG. 6(A)
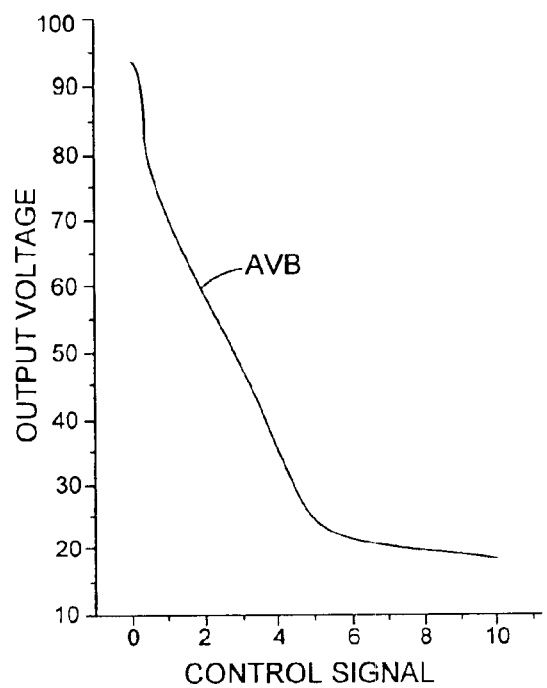
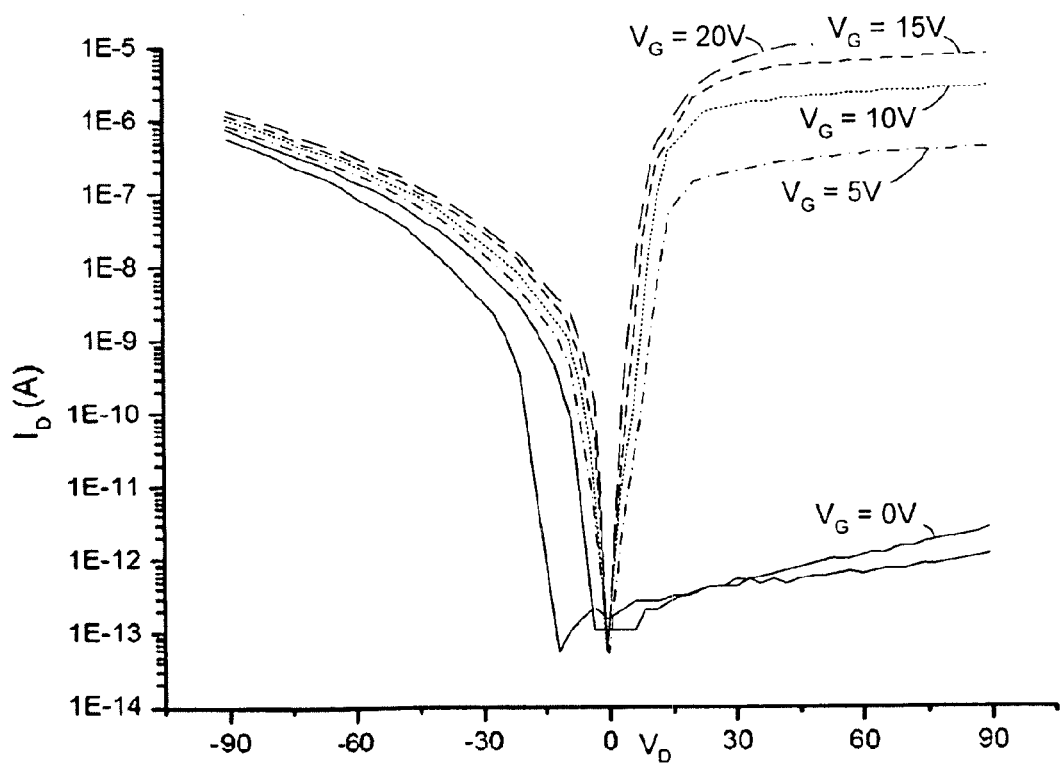
FIG. 6(B)

FIG. 7
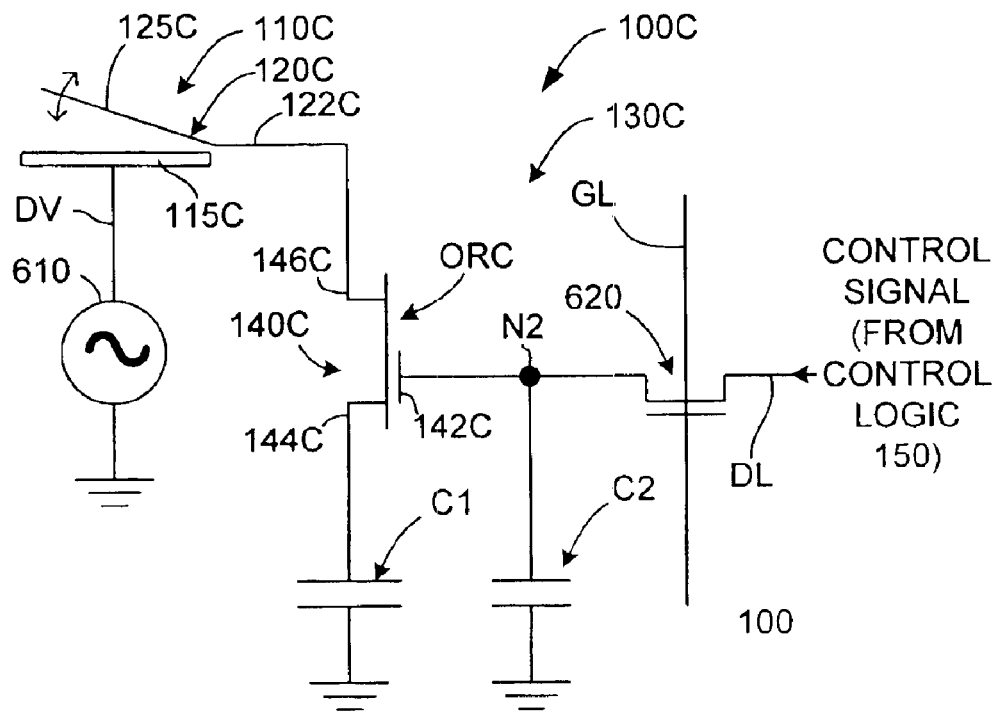
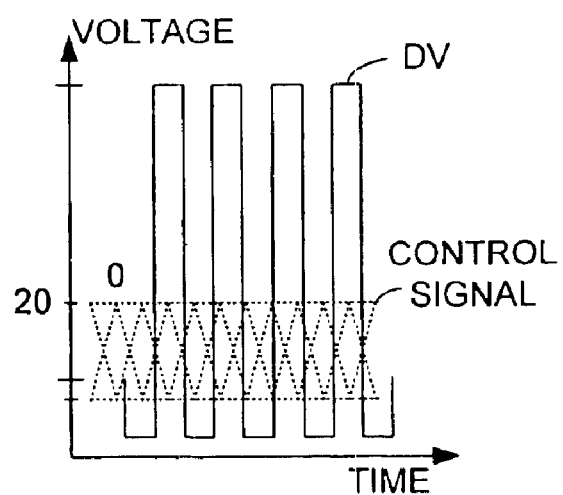
FIG. 8

INTEGRATED DRIVER ELECTRONICS FOR MEMS DEVICE USING HIGH VOLTAGE THIN FILM TRANSISTORS

FIELD OF THE INVENTION

This invention relates to microelectro-mechanical (MEMS) devices, and more particularly to actuated MEMS devices and driver circuits for controlling actuated MEMS devices.

BACKGROUND OF THE INVENTION

Photolithographically patterned micro spring structures (sometimes referred to as "microsprings") represent one form of MEMS devices that have been developed, for example, to produce low cost probe cards, and to provide electrical connections between integrated circuits. A typical micro spring structure includes a spring finger having an anchor portion secured to a substrate or other supporting structure, and a free (cantilevered) portion extending from the anchored portion over the substrate. The spring finger is formed from a stress-engineered film (i.e., a film fabricated such that portions closer to the underlying substrate have a higher internal compressive stress than portions located farther from the substrate) that is at least partially formed on a release material layer. The free portion of the spring finger bends away from the substrate when the release material located under the free portion is etched away, thereby "releasing" the spring finger portion from the substrate. The internal stress gradient is produced in the spring by layering, e.g., different metals having the desired stress characteristics, or by using a single metal by altering the fabrication parameters. Such spring structures may be used in probe cards, for electrically bonding integrated circuits, circuit boards, and electrode arrays, and for producing other devices such as inductors, variable capacitors, and actuated mirrors. For example, when utilized in a probe card application, the tip of the free portion is brought into contact with a contact pad formed on an integrated circuit, and signals are passed between the integrated circuit and test equipment via the probe card (i.e., using the spring structure as a conductor). Other examples of such spring structures are disclosed in U.S. Pat. No. 3,842,189 (Southgate) and U.S. Pat. No. 5,613,861 (Smith).

Recent developments related to micro spring-type MEMS devices include the ability to actuate (i.e., control the position of) a tip portion of a released spring finger by selectively applying an electrostatic actuating force to pull the cantilevered free portion toward the underlying substrate (i.e., against the bending force generated by the internal stress gradient of the spring finger). Electrostatic actuation is currently considered the most energy efficient method of actuating MEMS devices due to physical scaling laws. Electrostatically actuated MEMS devices utilize an electrode that is located adjacent to (e.g., on the substrate directly under) the free end of the spring finger, and associated driver circuit that applies a suitable voltage onto the electrode. The thus-charged electrode attracts the movable (e.g., free) portion of the MEMS device, causing this movable portion to bend toward the electrode against the biasing spring force produced by its internal stress gradient. By controlling the voltage level on the electrode, the position of the MEMS device relative to the supporting substrate can be altered between a fully deployed position (i.e., where the electrode voltage is minimized and the MEMS device is fully biased away from the substrate) and a fully retracted position (i.e., where the electrode voltage is maximized and the MEMS device is pulled against the electrode/substrate).

A problem associated with electrostatically actuated MEMS devices is that, although the actuating stroke length is generally proportional to the applied voltage, the maximum force is usually proportional to the voltage squared. Therefore, in practical applications, a high voltage (i.e., in excess of 50 Volts, often 100 V or more) is needed to drive these electrostatically actuated MEMS devices. Supplying this high voltage to the electrode of an electrostatically actuated MEMS device is not a major concern because many efficient DC—DC conversion power supplies are readily available, especially for the low current requirement of most electrostatically actuated MEMS devices. Controlling the high voltage, however, is not straight forward because such high voltages are not compatible with standard CMOS ULSI technology. That is, standard CMOS ULSI technology produces circuit structures having operating voltages in the range of about 0 V to 20 V. To address this high voltage control problem, special high voltage power chips are currently used to interface between the control circuitry and the actuated MEMS devices. Although such external power chips can be purchased "off the shelf" (i.e., relatively inexpensively), the use of external power chips requires a separate connection for each MEMS device. Accordingly, it would be very difficult and expensive to produce large MEMS device arrays using external power chips because the number of required interconnects increases as the square of array size, which increases both manufacturing time and cost.

What is needed is a method and structure that integrates electrostatically-actuated MEMS devices and high-voltage driver circuits with low voltage control circuitry on a single substrate, thereby facilitating the production of large electrostatically-actuated MEMS device arrays.

SUMMARY OF THE INVENTION

The present invention is directed to an apparatus that integrates actuated MEMS devices and high voltage driver (actuator) electronics on a single substrate, wherein the driver electronics utilize offset-gate, high-voltage thin-film transistors (HVTFTs) that facilitate the transmission of high actuating voltages to the actuated MEMS devices using relatively low control voltages, thereby facilitating the production of devices having large arrays of electrostatically-actuated MEMS devices. In one embodiment, each offset-gate HVTFT includes a controlling gate electrode, source electrode positioned relatively close to the gate electrode, and a drain electrode arranged in an offset position that is relatively far from the gate electrode, and such that a lateral offset region is defined between the drain electrode and the gate electrode. One major advantage of using offset-gate HVTFTs to control integrated MEMS/HVTFT apparatus is that the offset-gate HVTFTs can be made using typical TFT fabrication processes (which are generally compatible with the fabrication of MEMS devices), but provide unique input/output properties that facilitate control of the high actuating voltages using "normal" operating (i.e., gate) voltages. That is, the drain current of the offset-gate HVTFTs can be changed by eight orders of magnitude by changing the gate voltage between "normal" low and high operating voltage levels (e.g., −5V to 20V). This feature offers the possibility of designing driver circuits using conventional (i.e., symmetric) TFT control circuits that are subjected to "normal" operating voltage swings, and using offset-gate HVTFTs only in the last stage (i.e., to couple and decouple the MEMS device to/from the high actuating voltage).

According to an aspect of the present invention, the driver electronics for the integrated MEMS/HVTFT apparatus are arranged such that the drain electrode of selected HVTFTs are coupled to both an associated MEMS device and the high actuating voltage (i.e., a voltage source with a finite internal impedance), and the source electrode of the selected HVTFT is coupled to a low voltage source (e.g., ground). This arrangement reduces the chance of dielectric breakdown because the relatively high voltage potential generated by the actuating voltage is applied across the relatively large section of dielectric material provided in the offset region between the drain and gate electrodes, whereas the relatively small section of dielectric material provided between the source and gate electrodes are subjected to "normal" operating potentials. During operation, the actuating voltage applied to the MEMS device is inversely proportional to the control signal transmitted on the gate electrode. For example, to fully retract the MEMS device, a minimum (low) control signal voltage (e.g., zero volts) is applied to the gate electrode of the HVTFT, thereby turning off the HVTFT and isolating the high actuating voltage on the drain electrode of the HVTFT (i.e., applying the entire actuating voltage to the MEMS device). To maintain the MEMS device in a partially deployed position, an intermediate control signal voltage (e.g., 5 V) is transmitted on the gate electrode of the HVTFT, thereby partially turning on the HVTFT and reducing the actuating voltage on the drain electrode to an intermediate level. To fully deploy the MEMS device, a maximum (high) control signal voltage (e.g., 20 V) is applied to the gate electrode of the HVTFT, thereby fully turning on the HVTFT and grounding the drain electrode (i.e., essentially eliminating the actuating voltage passed to the MEMS device).

According to a specific embodiment of the present invention, an active load driver circuit includes two offset-gate HVTFTs connected in series between the high voltage source and ground, with the first HVTFT having gate and source electrodes connected to the high voltage source, the second HVTFT having a source electrode connected to ground and a gate electrode connected to receive the "normal" voltage control signal. The actuating electrode of an associated MEMS device is controlled by an intermediate node connected to the drain electrodes of the two HVTFTs. In this arrangement, the first HVTFT serves as a resistor between the high voltage source and the intermediate node, thereby eliminating the need for a costly and space inefficient resistor structure.

According to a second specific embodiment of the present invention, a driver circuit includes an alternating-current (AC) voltage supply that transmits a high voltage AC signal onto the actuating electrode (or anchor portion of a MEMS structure) of an associated MEMS device, and an associated HVTFT has a drain electrode connected to the anchor portion of the MEMS structure (or actuating voltage), a source electrode coupled to a low voltage source (e.g., via a capacitor), and a gate electrode connected to receive a "normal" control signal from the control circuit. Similar to the first specific embodiment, the HVTFT is arranged to prevent high voltages across the source/gate dielectric, thereby minimizing dielectric breakdown.

BRIEF DESCRIPTION OF THE DRAWINGS

These and other features, aspects and advantages of the present invention will become better understood with regard to the following description, appended claims, and accompanying drawings, where:

FIG. 6(A) is a graph depicting experimentally generated data showing a variation of electrode voltage to control signal using the high voltage driver circuit of FIG. 4;

FIG. 6(B) is a graph showing output characteristics associated with a-Si HVTFTS;

FIG. 7 is a simplified diagram showing a high voltage driver circuit for controlling an electrostatically actuated MEMS device according to yet another embodiment of the present invention; and FIG. 8 is a graph depicting an exemplary high voltage AC signal utilized in the high voltage driver circuit of FIG. 7;

DETAILED DESCRIPTION OF THE DRAWINGS

Figure 1:
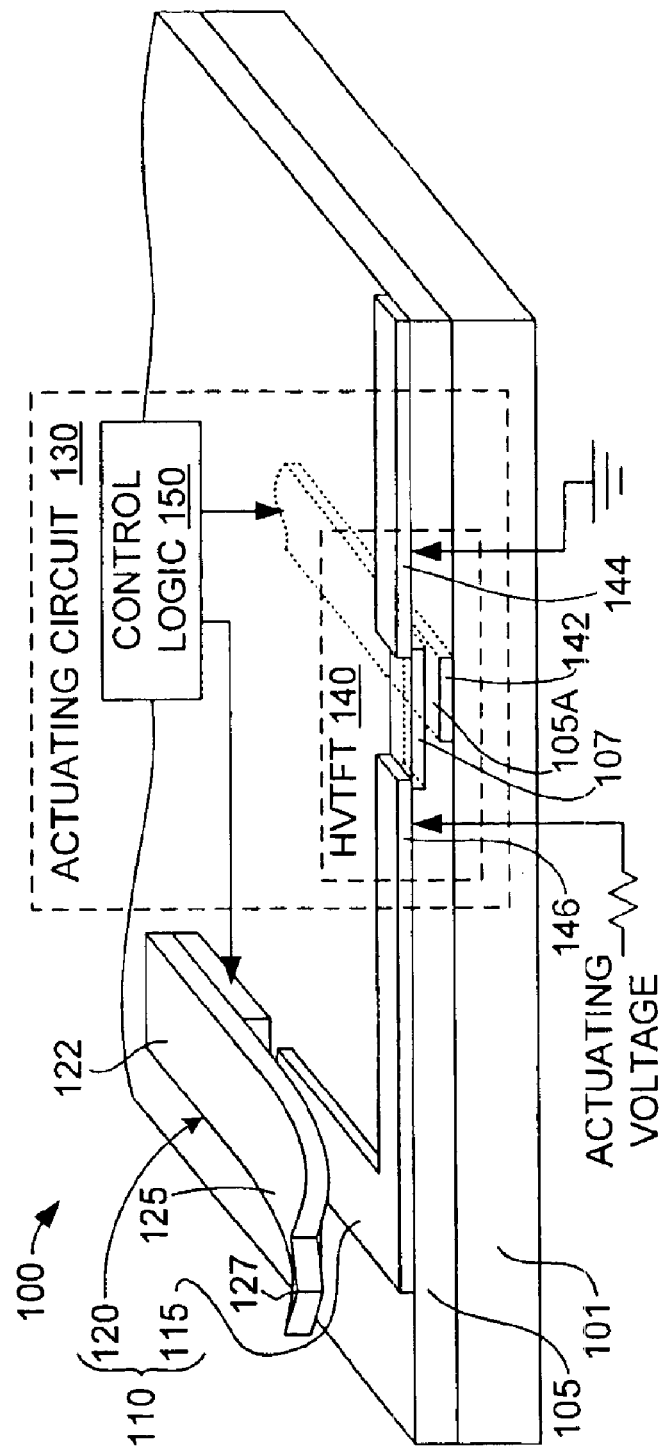
FIG. 1 is a perspective view showing an apparatus including an electrostatically-actuated MEMS device and an offset-gate HVTFT according to a simplified embodiment of the present invention.

FIG. 1 is a perspective view showing a simplified apparatus 100 according to an exemplary embodiment of the present invention. Apparatus 100 includes an actuated MEMS device 110 and an actuating (driver) circuit 130 that are integrally fabricated on a substrate 101. According to the present invention, actuating (driver) circuit 130 includes an offset-gate HVTFT 140 that is utilized to selectively transmit a relatively high actuating voltage (i.e., 50 V or greater) in response to a relatively low control voltage (i.e., 10 V or less) that is provided from an associated control logic circuit 150.

According to an aspect of the invention, substrate 101 is formed using an insulating material such as glass, ceramic, plastic, and a flexible substrate, and in one embodiment includes at least one dielectric layer 105 and a semiconductor layer 107 formed thereon. In the disclosed embodiment, a semiconductor region 107 is formed using any of amorphous silicon (a-Si:H), polycrystalline silicon, and organic material. In alternative embodiments, substrate 101 may be formed using conductive materials, such as stainless steel, and may also comprise a semiconductor material such as silicon or gallium arsenide (with or without an active integrated circuit including, for example, control logic circuit 150).

As used herein "actuated MEMS device" refers to an integration of a micromechanical MEMS structure and an actuating electrode that are combined on a common substrate through microfabrication technology. In particular, the actuating electrodes (and associated control circuitry) are fabricated using selected integrated circuit (IC) process sequences, and the MEMS structures are fabricated using "micromachining" processes that are compatible with the selected IC process sequences. Referring to the left side of FIG. 1, in the disclosed embodiment, actuated MEMS device 110 includes a fixed actuating electrode 115 formed over the substrate (i.e., on dielectric layer 105), and a micro spring (MEMS) structure (i.e., a movable counterpart) 120 including an anchor portion 122 that is fixedly (rigidly) attached to substrate 101, and a cantilevered movable (free) portion 125 that extends from anchor portion 122 over actuating electrode 115. As described in detail below, micro spring structure 120 is produced such that it includes an internal stress (or strain) gradient that biases free portions 125 away from substrate 101, thereby producing the indicated curved shape that points tip 127 in a direction away from actuating electrode 115. In other embodiments, the movable counterpart of an actuated MEMS device may include, for example, a metal beam or diaphragm that is electrostatically actuated in response to an actuating voltage applied to one of the movable counterpart or the fixed electrode (with the other structure grounded or coupled to a suitable signal). In another alternative embodiment, the movable counterpart of an actuated MEMS device may be actuated by two fixed electrodes that are capacitively coupled to the movable counterpart, with one of the fixed electrodes held at ground and the other fixed electrode selectively receiving a control (high) voltage.

Figure 2A:
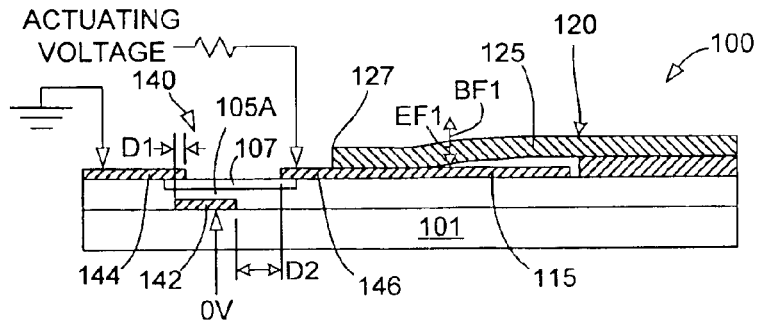
FIGS. 2(A), 2(B), and 2(C) are cross-sectional side views showing the electrostatically-actuated MEMS device of FIG. 1 in various actuated positions.

In accordance with the present invention, each HVTFT is a Thin Film Transistor (TFT) in which the shortest distance between any part of the drain electrode and controlling gate electrode is significantly larger than the thickness of gate dielectric (i.e., the distance between the gate electrode and the source electrode), such that the break down voltage between drain and source is larger than the break down voltage between gate and source. Referring to the center of FIG. 1, in the disclosed embodiment each HVTFT 140 generally includes a controlling gate electrode 142 formed on substrate 101 below dielectric layer 105, a source electrode 144 and a drain electrode 146 formed on the dielectric layer 105 and on opposite ends of semiconductor region 107. In an alternative embodiment (not shown), the source and drain electrodes and semiconductor region may be located under the gate electrode (i.e., with gate dielectric region 105A formed therebetween). As indicated in FIG. 2(A), according to an aspect of the present invention, each HVTFT 140 is distinguished over standard TFTs in that gate electrode 142 is offset (i.e., such that a portion of source electrode 144 is substantially located over or laterally overlaps gate 142, e.g., by a distance D1, but in contrast drain electrode 146 is laterally offset from gate structure 142 by a distance D2). That is, this offset-gate arrangement differs from the source/drain symmetry associated with standard TFTs, and facilitates the controlled passage of high voltages (e.g., 50 to 400 V or higher, depending on the selected scaling) using a relatively low control voltage (e.g., 0 to 20 V) generated by control logic circuit 150, which in one embodiment is fabricated using conventional CMOS techniques or TFT circuits. As indicated in FIG. 1, according to an aspect of the present invention, HVTFT 140 is arranged such that drain terminal 146 is coupled to the high actuating voltage (ACTUATING VOLTAGE SOURCE, which in one embodiment is a voltage source with a finite internal impedance) used to actuate MEMS device 110, and source terminal 144 is connected to a low voltage source (e.g., ground). As described in additional detail below with reference to FIGS. 2(A) through 2(C), with this arrangement the actuating voltage applied to MEMS device 110 is inversely proportional to the control signal transmitted on gate electrode 142. Accordingly, the present invention facilitates the control of the high actuating voltages applied to MEMS device 110 using relatively low control voltages transmitted on gate electrode 142, while minimizing the chance of dielectric breakdown caused by the transmitted high actuating voltages.

Figure 2B:
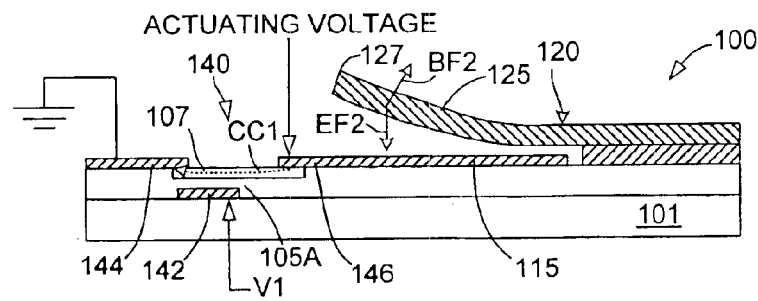
Figure 2C:
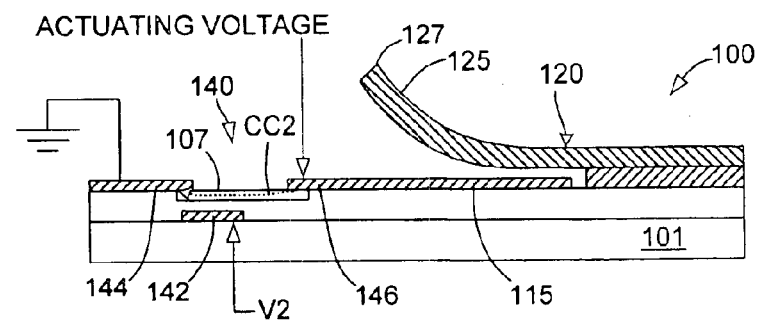

FIGS. 2(A) through 2(C) depict MEMS device 110 during various states of actuation.

FIG. 2(A) depicts MEMS device 110 in a fully retracted position in which tip 127 contacts actuating electrode 115 and/or other structures formed on substrate 101 (e.g., an electrically insulating film formed on electrode 115). This fully retracted position is achieved when a gate voltage transmitted on gate electrode 142 by control logic circuit 150 (FIG. 1) is minimized (e.g., zero volts), thereby turning off HVTFT 140 and preventing the high voltage present on drain electrode 146 (and actuating electrode 115) from passing to source electrode 144. With actuating electrode 115 essentially connected to the high voltage source, a relatively strong (first) electrostatic field EF1 is generated that causes movable portion 125 to move into the fully retracted position shown in FIG. 2(A).

FIG. 2(B) depicts MEMS device 110 in a partially retracted position in which tip 127 of micro spring structure 120 is between the fully retracted position shown in FIG. 2(A) and the fully deployed position described below. This partially retracted position is achieved when MEMS device 110 is in a partially turned on state, that is, when a gate voltage V1 transmitted on gate electrode 142 by control logic circuit 150 (FIG. 1) is at a selected intermediate level (e.g., 5 V) that partially turns on HVTFT 140. With HVTFT partially turned on, a control current CC1 is generated from drain electrode 146 to source electrode 144 that reduces the voltage on actuating electrode 115, which in turn weakens the attractive electrostatic force transmitted from actuating electrode 115 on movable portion 125 of micro spring structure 120. Under the influence of this reduced electrostatic field, movable portion 125 bends away from substrate 101, due to its internal stress gradient, until the bending force BF1 generated by the internal stress gradient balances with the relatively weak (second) electrostatic field EF2 movable portion 125, thereby moving into the partially retracted position relative to substrate 101 that is shown in FIG. 2(B).

FIG. 2(C) depicts MEMS device 110 in a fully deployed position in which tip 127 of micro spring structure 120 is at a maximum distance from actuating electrode 115. This fully deployed position is achieved when MEMS device 110 is in a fully turned on state, that is, when a gate voltage V2 transmitted on gate electrode 142 is at a maximum level (e.g., 10 V) that fully turns on HVTFT 140, thereby draining the maximum control current CC2 (e.g., 100 V) from actuating electrode 115 (via channel 105A and source electrode 144 to ground). With full control current CC2 drained from actuating electrode 115, no electrostatic force is applied to micro spring finger 120, thereby causing movable portion 125 to bend away from substrate 101 due to its internal stress gradient.

FIGS. 3(A) through 3(H) depict a process for fabricating an integrated MEMS/HVTFT apparatus according to another embodiment of the present invention.

Figure 3A:
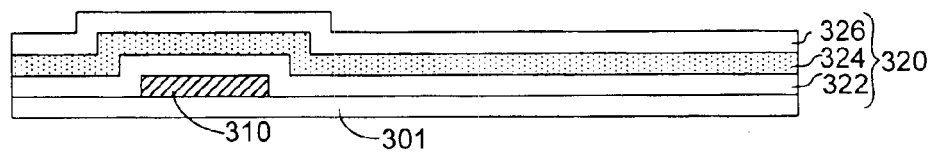
FIGS. 3(A), 3(B), 3(C), 3(D), 3(E), 3(F), 3(G), and 3(H) are simplified cross-sectional side views showing the fabrication of an integrated MEMS/HVTFT apparatus according to another embodiment of the present invention.

FIG. 3(A) depicts the formation of a gate electrode 310 on a substrate 301 (which is omitted from 3(B) through 3(H) for brevity) according to known techniques. Formed over gate electrode 310 and exposed surface of substrate 301 is an a-Si:H layer 320 including a lower nitride layer 322, an intermediate silicon (undoped) layer 324 (which forms the semiconductor region of the subsequently formed TFT structures), and an upper nitride layer 326.

Figure 3B:
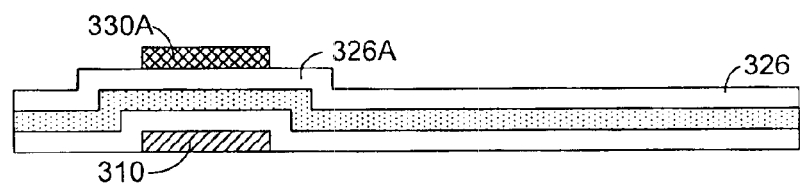

Referring to FIG. 3(B), a first resist portion 330A is formed on a first section 326A of upper nitride layer 326 over gate electrode 310, e.g., using know backside illumination techniques.

Figure 3C:
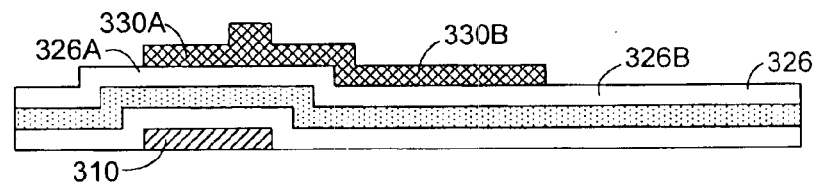

As depicted in FIG. 3(C), using first resist portion 330A as an alignment structure, a second resist portion 330B is then formed using known techniques such that second resist portion 330B extends from first section 326A over a second section 326B of upper nitride layer 326.

Figure 3D:
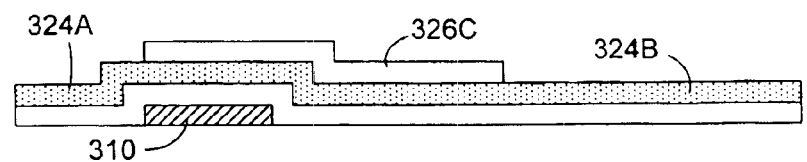

Exposed sections of upper nitride layer 326 are then etched using known techniques, resulting in upper nitride portion 326C (FIG. 3(D)).

Figure 3E:
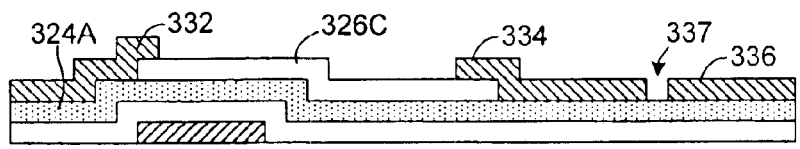

Referring to FIG. 3(E), a metal layer, or a doped a-Si:H and metal multi-layer, is then deposited and patterned to form a source electrode 332 that extends partially over a first edge of upper nitride portion 326C, a drain/actuating electrode 334 that extends partially over a second edge of upper nitride portion 326C, and an electrode 336 that is separated from drain/actuating electrode 334 by a gap 337.

Figure 3F:
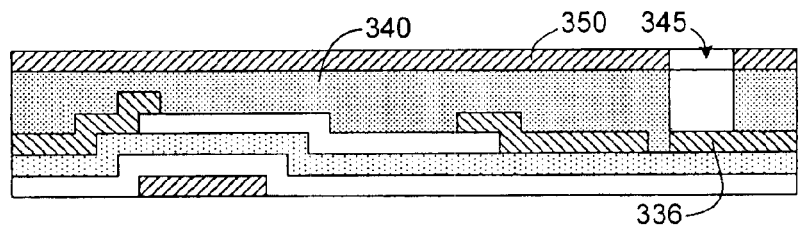

Referring to FIG. 3(F), an interlayer (second) dielectric layer 340 (e.g., _Silicon Oxynitride, BCB, or polyimide) and a release (sacrificial) material layer 350 are then formed over the existing structure, and patterned using known techniques to form an opening 345 that exposes a portion of electrode 336. In one embodiment, release material layer 350 is Titanium (Ti) that is deposited (e.g., sputtered) to a thickness of approximately 0.05 microns or greater. Other release materials having the beneficial characteristics of titanium may also be used, and may include at least one of Copper (Cu), Aluminum (Al), Nickel (Ni), Zirconium (Zr), Cobalt (Co), or a non-conducting material such as silicon (Si) or Silicon Nitride (SiN). Further, two or more release material layers can be sequentially deposited to form a multi-layer structure. In yet another possible embodiment, any of the above-mentioned release materials can be sandwiched between two non-release material layers (i.e., materials that are not removed during the spring release process, described below).

Figure 3G:
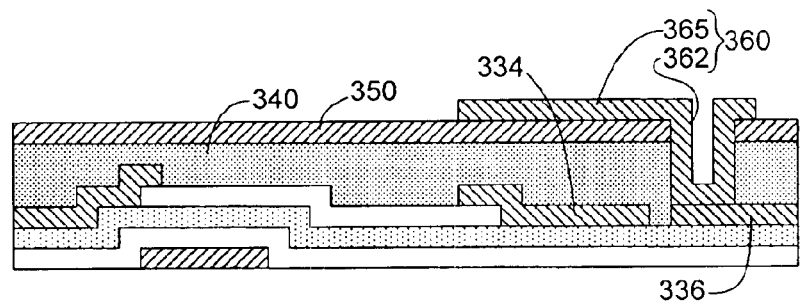

Subsequently, as shown in FIG. 3(G), a stress-engineered spring structure 360 is formed by depositing and patterning a spring material layer on release layer 350 such that an anchor portion 362 extends into opening 345 and contacts electrode 336, and a movable portion 365 extends over at least a portion of drain/actuating electrode 334 (i.e., either directly over the actuating electrode, or laterally offset from, for example, a tapered actuating electrode such those as disclosed in U.S. Pat. No. 6,734,425 (issued from application Ser. No. 10/136,258, entitled "SCANNING PROBE SYSTEM WITH SPRING PROBE AND ACTUATION/SENSING STRUCTURE", which is incorporated by reference in its entirety. In one embodiment, the spring material forming spring structure 360 is a stress-engineered metal film formed such that it includes internal stress variations in the growth direction (that is, the internal stress varies in proportion to its vertical thickness or distance from the release layer 350. Methods for generating internal stress variations in spring structure 360 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, spring structure 360 includes one or more metals suitable for forming a micro spring finger (e.g., one or more of molybdenum (Mo), a "moly-chrome" alloy (MoCr), tungsten (W), a titanium-tungsten alloy (Ti:W), chromium (Cr), and nickel (Ni)). The thickness of spring structure 360 is determined in part by the selected spring material, an applied coating (when used), and the desired spring constant and shape of the final micro spring structure. Note that, in an alternative embodiment, spring structure 360 can be formed using known TFT compatible MEMS deposition processes, including a low stress metal MEMS process, polymer MEMS process, or low temperature bonding to traditional Si MEMS process.

Figure 3H:
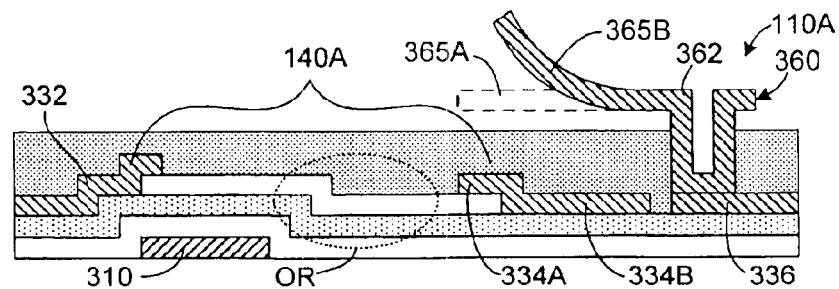

Finally, release material layer 350 is removed (etched) to release movable portion 365 of spring structure 360. As indicated in FIG. 3(H), the removal of the release material layer causes the released movable portion to move from fully retracted position 365A to fully deployed position 365B due to the internal stress gradient.

Referring again to FIG. 3(H), subsequent operation of actuated MEMS device 110A and HVTFT 140A is essentially as described above with reference to the embodiment shown in FIG. 1. Note that HVTFT 140A defines an offset region OR between a right edge of gate electrode 310 and drain electrode 334A. Note also that, unlike in the previous embodiment, interlayer dielectric layer 340 is positioned between actuating electrode 334B and movable portion 365B of spring structure 360.

In addition to the general scheme of using HVTFTs as basic building blocks for MEMS device driver circuits, as described above, the present invention is also directed to specific driver circuits, which are described in the following exemplary embodiments. In particular, conventional high voltage driver circuits typically utilize high value resistors (in Giga-Ohm range). A problem with using such resistor-based driver circuits is that these resistors are difficult to integrate on-chip, as they require significant chip space and require extra mask steps. Another draw back of using resistors are the difficulty of controlling the exact resistance value. These resistors also result in steep transfer curves that give poor analog actuation control, and are better suited for binary applications.

Figure 4:
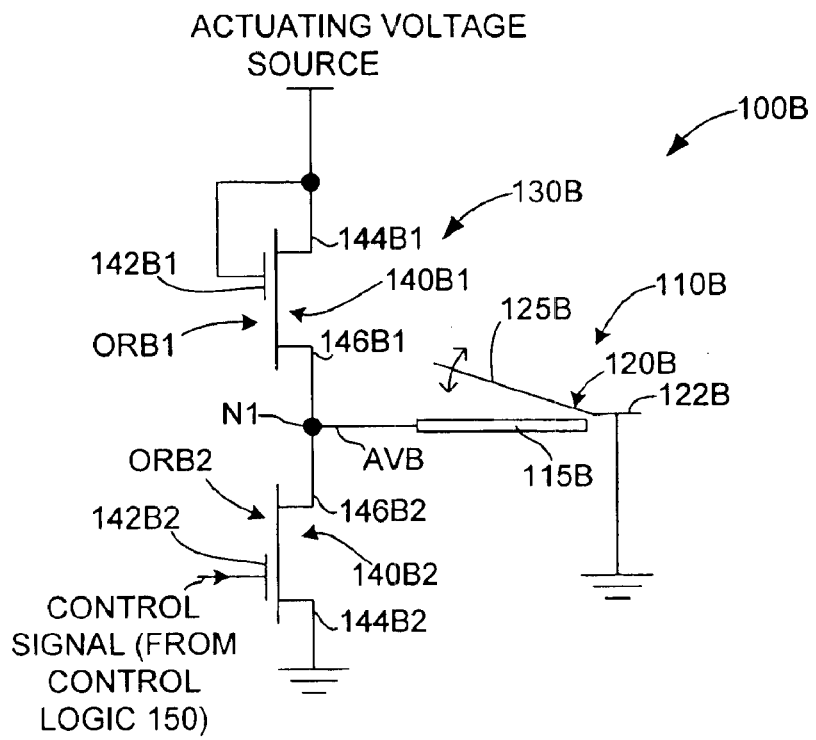
FIG. 4 is a simplified diagram showing an apparatus including a high voltage driver circuit for controlling an electrostatically actuated MEMS device according to another embodiment of the present invention.

FIG. 4 is a simplified diagram showing an apparatus 100B including "all-transistor" high voltage driver circuit 130B for controlling an electrostatically actuated MEMS device 110B according to another embodiment of the present invention. Driver circuit 130B utilizes two offset-gate HVTFTs 140B1 and 140B2 connected in series between a high voltage source and ground, with an intermediate node N1 being connected to actuating electrode 115B of actuated MEMS device 110B. First (load) HVTFT 140B1 has a source electrode 144B1 connected to the high voltage source, a drain electrode 146B1 connected to intermediate node N1, and gate electrode 142B1 also connected to the high voltage source and offset such that an offset region ORB1 is located between gate electrode 142B1 and drain electrode 146B1 (i.e., away from the high voltage source). Note that source electrode 144B1 and gate electrode 142B1 are both connected to the high (actuating) voltage source. In contrast, second (control) HVTFT 140B2 has a source electrode 144B2 connected to ground, a drain electrode 146B2 connected to intermediate node N1, and gate electrode 142B2 arranged such that offset region ORB2 is located between gate electrode 142B2 and drain electrode 146B2 (i.e., away from ground). An input voltage (e.g., received from control logic circuit 150; see FIG. 1) is applied to gate terminal 142B2, and controls the actuating voltage AVB at intermediate node N1 (and, thus, on actuating electrode 115B) by controlling the conductance of second HVTFT 140B2. Similar to the embodiments described above, actuated MEMS device 110B includes a MEMS structure 120B having an anchor portion 122B connected to a low voltage source (e.g., ground), and a movable portion 125B positioned over actuating electrode 115B. When the actuating voltage AVB on actuating electrode 115B is low (i.e., when second HVTFT 140B2 is turned on by a high control voltage on gate terminal 142B2), the internal stress gradient of MEMS structure 120B causes movable portion 125B to bend away from actuating electrode 115B. Conversely, when the actuating voltage AVB on actuating electrode 115B is high (i.e., when second HVTFT 140B2 is turned off by a low control voltage on gate terminal 142B2), the electrostatic force applied on MEMS structure 120B from actuating electrode 115B overcomes the bending force generated by the internal stress gradient, thereby causing movable portion 125B to bend toward actuating electrode 115B in the manner described above. Accordingly, the "all-transistor" high voltage driver circuit 130B shown in FIG. 4 facilitates actuation of MEMS device 110B while avoiding the problems associated with resistor-based driver circuits, described above.

Applicants point out that standard low voltage NMOS circuits use load transistors in a manner similar to that utilized by driver circuit 130B in place of a high value resistor. In high voltage circuits, however, it is not obvious that simply replacing resistors with HVTFTs will operate as intended. If load HVTFT 140B1 were arranged with the drain electrode 146B1 (i.e., the side with the offset region) connected to the high voltage source as one would expect to keep HVTFT 140B1 in normal biased region, then load HVTFT 140B1 will most likely burn (be destroyed) immediately because the maximum voltage between gate and source region is limited by the break down voltage of the gate dielectric, which is typically around 40V.

Figure 5:
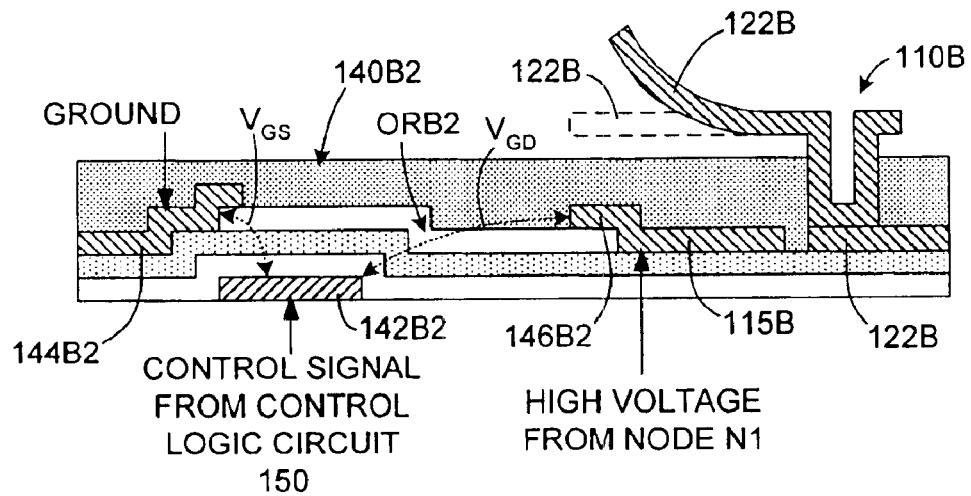
FIG. 5 is a simplified cross-sectional side views showing a portion of the apparatus of FIG. 4.

Further, fabricating apparatus 100B using the process flow described with reference to FIGS. 3(A) through 3(H) not only provides three-dimensional (3D) integration of MEMS device 110B and driver circuit 130B (FIG. 4), but also enables superior voltage isolation. As indicated in FIG. 5, the high voltage applied to actuating electrode 115B from node N1 is applied to drain electrode 146B2, which is separated from gate electrode 142B2 by lateral offset region ORB2, thereby applying drain/gate region $V_{GD}$ over a relatively wide section of dielectric material. In contrast, as indicated on the left side of FIG. 5, source/gate voltage $V_{SG}$, which is maintained at "normal" (i.e., relatively low) operating voltages, is applied across a relatively narrow section of dielectric material separating source electrode 144B2 and gate electrode 142B2. Accordingly, by providing a suitably wide offset region ORB2, driver circuit 130B (FIG. 4) is constructed such that the probability of dielectric breakdown due to the high actuating voltage applied across HVTFT 140B2 is minimized. Further, although not shown, thick interlayer dielectric insulator and air bridge crossover structures are provided at all high voltage cross-over points (i.e., where metal lines connected to the high actuating voltage source cross metal lines connected to the control logic circuit or ground), thereby minimizing crossover dielectric breakdown.

FIG. 6(A) depicts a graph showing an experimentally generated typical actuating voltage AVB which was generated by the circuit shown in FIG. 4 (i.e., using a-Si:H HVTFTS), which suggests important information for building transistor only NMOS circuits. As indicated in FIG. 6(B), in the reverse bias region (i.e., −100V<VDS<0V), substantial, controllable current flows through the HVTFTS, while VGS is limited to 20V. All transistor HVTFT inverters operating at 100V has been demonstrated with input voltage from 0 to 10V, which can be generated using standard digital-to-analog (D/A) circuits.

FIG. 7 is a simplified circuit diagram showing an apparatus 100C including a driver circuit 130C that drives an actuated MEMS device 100C using an AC high voltage supply 610 and an associated offset-gate HVTFT 140C according to another specific embodiment of the present invention. AC high voltage supply 610 transmits a high voltage AC signal DV to actuating electrode 115C of actuated MEMS device 110C. Actuated MEMS device 110C also includes a MEMS structure 120C having an anchor portion 122C and a movable portion 125C positioned over actuating electrode 115C. Anchor portion 122C is connected to a drain electrode 146C of offset-gate HVTFT 140C, which also includes a source electrode 144C coupled to ground via a source (first) capacitor C1, and a gate electrode connected to a node N2, which receives a control (data) signal via a "normal" (i.e., symmetrical) TFT 620 and is also coupled to ground via a second capacitor C2. Similar to previous embodiments, associated HVTFT 140C is controlled (turned on and off) by the data signal transmitted on a data line DL, which is selectively passed by TFT 620 in response to a gate signal transmitted on gate line GL. As indicated in FIG. 8, the amplitude of the control signal transmitted on data line DL is substantially lower than that of the high voltage AC signal DV. The purpose of this control circuit is for quasi-static actuating the MEMS device, and the control signal should be a low voltage, near DC signal relative to the high voltage AC source. During operation, when AC high voltage signal DV is in the positive high voltage cycle, actuating electrode 115C is charged until the voltage of source capacitor C1 is higher than the control voltage received from data line DL minus the threshold voltage of HVTFT 140C. In the negative cycle portion of the high voltage signal DV, charge on both actuating electrode 115C and source capacitor C1 is discharged through the HVTFT 140C as HVTFT 140C is operated under reversed bias region, −100<Vds<0, as shown in FIG. 6(B), thus becoming ready for the next cycle. With this configuration, as long as the frequency of high voltage AC signal DV is much higher than the resonance frequency of MEMS device 110C, MEMS device 110C only receives the RMS average of the applied voltage, which is controlled by source capacitor C1 and the input control voltage received on data line DL. Employing charge mode electrostatic driving essentially eliminates the snap-down instability of MEMS device 110C and greatly improves the linear controllable region of the electrostatic actuator (ideally, the electrostatic force between two parallel plates is proportional to the charge square and independent of the gap). Note that the arrangement shown in FIG. 7 may be reversed (i.e., with AC signal DV applied to anchor portion 122C and actuating electrode 115C connected to HVTFT 140C).

Figure 9:
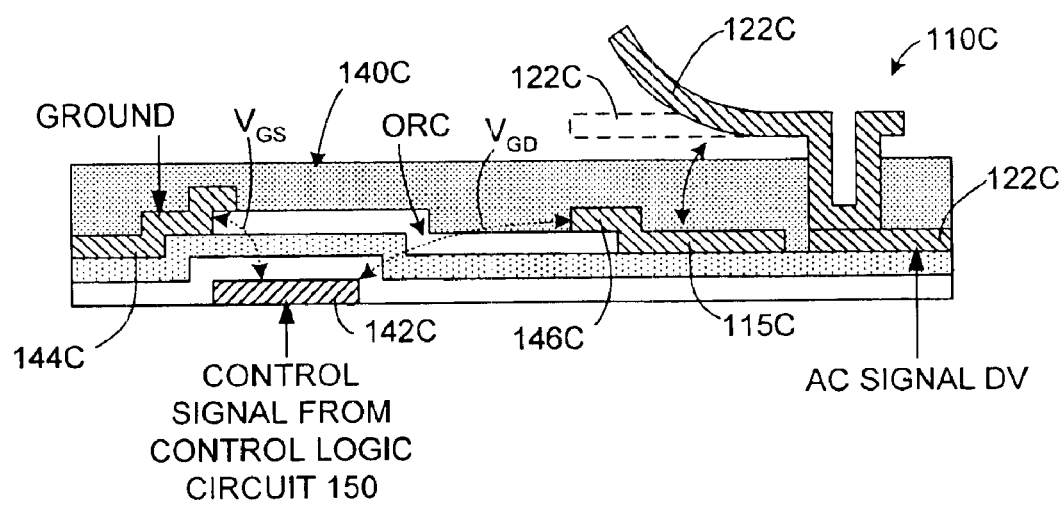
FIG. 9 is a simplified cross-sectional side views showing a portion of the apparatus of FIG. 7.

In addition, as indicated in FIG. 9 and similar to the driver circuit described above with reference to FIG. 4, driver circuit 130C avoids cross-over dielectric breakdown by limiting the high voltage to electrode 115C (i.e., from its coupling with movable portion 122C) and drain electrode 146C, which is separated from gate electrode 142C by lateral offset region ORC, thereby applying drain/gate region $V_{GD}$ over a relatively wide section of dielectric material.

Figure 10:
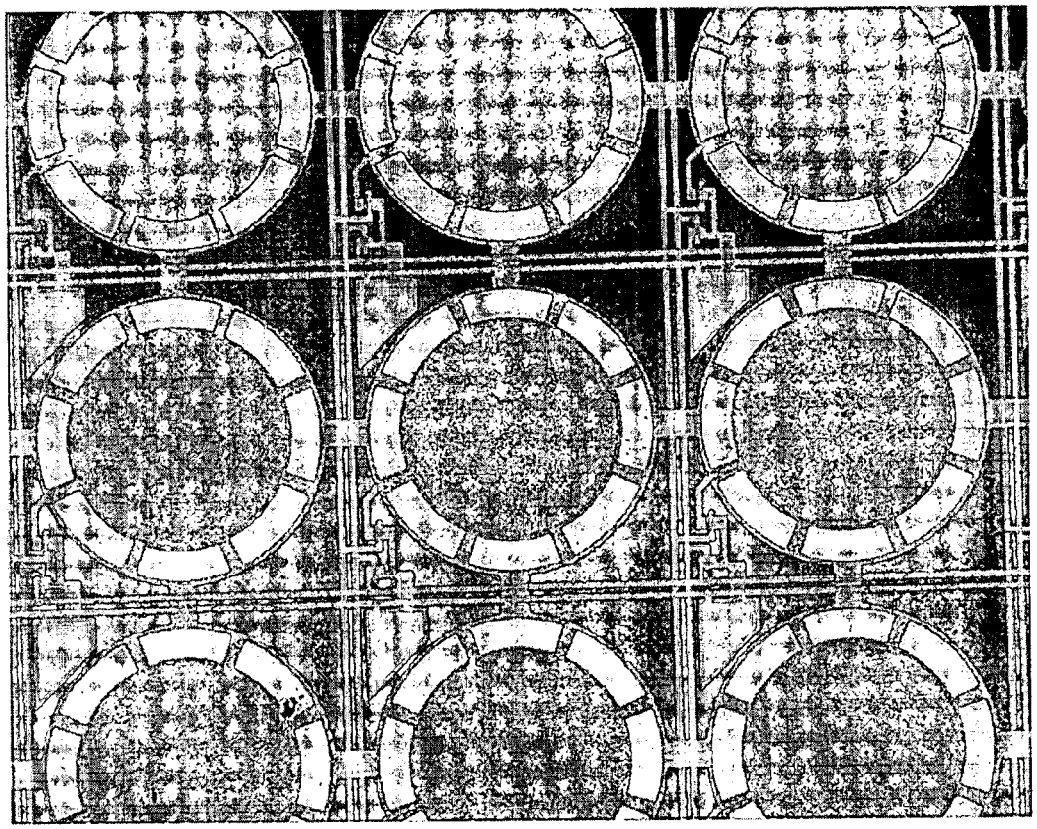
FIG. 10 is a photograph showing a portion of a MEMS device array including electrostatically actuated MEMS diaphragms controlled by offset-gate HVTFTs according to yet another embodiment of the present invention.

A main advantage provided by the present invention is that apparatus integrating both electrostatically actuated MEMS devices and HVTFT-based driver circuits in the manner described above are able to support large-scale MEMS arrays using a minimum number of surface contacts. Large-scale MEMS arrays (i.e., including multiple rows and columns of actuated MEMS devices) are particularly useful for building complex actuation systems, such as the MEMS diaphragm array depicted in FIG. 10. It would be very difficult to realize the large size of such systems if driver electronics are not integrated in the pixel level because the number of required interconnects increases as the square of array size. The HVTFT-based driver circuits described herein provide a solution for building this type of large-scale MEMS array actuating system. Active Matrix switching networks similar to those used to drive Active Matrix Liquid Crystal Displays are a natural solution for driving arrays of MEMS devices with only reasonable amount of peripheral circuits.

Accordingly, the present invention provides HVTFT-based driver circuits that facilitate integrated driver control on electrostatically actuated MEMS device arrays. Compared to conventional CMOS technology, TFT electronics have the advantage of versatility of choosing substrate, large area, and low cost per unit area. Versatility of choosing substrate is a major advantage: 1) standard glass substrate provides superior isolation such that high voltage is easy to handle, 2) glass or other transparent substrates provide wide freedom of designing optical system, 3) glass, ceramic, or other insulative substrates provide low loss to high frequency EM signal and are particular useful for high frequency application, 4) glass is a standard bio-compatible substrate, 5) flexible plastic substrate allow for novel curved substrate applications and 6) even conventional active ICs to form a completely integrated system. Large area enables large systems, particularly large array of MEMS actuators. The manufacturing cost per unit area of thin film process is typically in the range of tens of cents/in$^2$, several orders of magnitude lower than conventional ULSI CMOS. The length scale of TFT process (several microns) matches well with typical MEMS devices since the size of MEMS devices is closely related to their functionality, and often not always possible to scale down.

Although the present invention has been described with respect to certain specific embodiments, it will be clear to those skilled in the art that the inventive features of the present invention are applicable to other embodiments as well, all of which are intended to fall within the scope of the present invention. For example, while the invention has been described herein with reference to micro spring-type MEMS devices, the present invention may also be used to drive other types of actuated MEMS devices, some of which are mentioned above. In addition, although the disclosed embodiments utilize n-channel devices, equivalent circuits can also be generated using p channel or mixed n channel and p channel devices.

What is claimed is:

1. An apparatus comprising:
    a substrate;
    a driver circuit including a plurality of high-voltage thin-film transistors (HVTFTs) formed on the substrate, each HVTFT including a controlling gate electrode, a source electrode, and a drain electrode arranged such that the source electrode is separated from the controlling gate electrode by a first distance, and the drain electrode is spaced from the controlling gate electrode such that a shortest distance between any part of the drain electrode and the controlling gate electrode is significantly larger than the first distance, and such that a first break down voltage between the drain electrode and the source electrode is larger than a second break down voltage between the controlling gate electrode and the source electrode; and
    a plurality of actuated MEMS devices formed on the substrate, wherein each of the actuated MEMS device is connected to the drain electrode of an associated HVTFT of the plurality of HVTFTs.

2. The apparatus according to claim 1,
    wherein the drain electrode of each said associated HVTFT is connected to an actuating voltage source, and each the source electrode of each said associated HVTFT is connected to a low voltage source,
    wherein driver circuit includes means for selectively generating a control signal on the controlling gate electrode of each said associated HVTFT such that when the control signal is maintained at a selected control voltage level, said associated HVTFT is fully turned on to couple the drain electrode to the low voltage source, and
    wherein the selected control voltage level is substantially lower than an actuating voltage supplied by the actuating voltage source to the source electrode of the associated HVTFT.

3. The apparatus according to claim 1, wherein each of the actuated MEMS devices comprises:
    an actuating electrode formed on a dielectric layer; and
    a MEMS structure including an anchor portion rigidly attached to the substrate, and a movable portion extending from the anchor portion and located adjacent to the actuating electrode,
    wherein the MEMS structure is fabricated with an internal stress gradient such that the movable portion bends into a first position relative to the substrate when the electrode generates a first electrostatic field, and the movable portion bends into a second position relative to the substrate when the electrode generates a second electrostatic field.

4. The apparatus according to claim 1, wherein the substrate comprises one of glass, ceramic, plastic, stainless steel, a flexible substrate, and a semiconductor material.

5. The apparatus according to claim 1, wherein the substrate comprises an active integrated circuit including a logic control circuit coupled to the controlling gate electrode of the HVTFT.

6. The apparatus according to claim 1, wherein the driver circuit comprises:
    a first HVTFT having a first controlling gate electrode and a source electrode connected to an actuating voltage source, and a first drain electrode connected to an intermediate node;
    a second HVTFT having a second drain electrode connected to the intermediate node, a second source electrode connected to a low voltage source, and a second controlling gate electrode; and
    means for selectively generating a maximum control voltage on the second controlling gate electrode, whereby the second HVTFT is turned on to couple the second drain to the low voltage source,
    wherein the maximum control voltage is substantially lower than an actuating voltage supplied by the actuating voltage source to the first source electrode.

7. The apparatus according to claim 6, wherein an associated actuated MEMS device of the plurality of MEMS devices comprises:
    an actuating electrode formed on a dielectric layer and connected to the intermediate node; and a MEMS structure including an anchor portion rigidly attached to the substrate, and a movable portion extending from the anchor portion and located adjacent to the actuating electrode, wherein the MEMS structure includes an internal stress gradient formed such that the movable portion bends away from the actuating electrode when the maximum control voltage is applied to the second controlling gate electrode.

8. The apparatus according to claim 1, wherein an associated actuated MEMS device of the plurality of MEMS devices comprises:

an actuating electrode formed on a dielectric layer, and a MEMS structure including a movable portion located adjacent to the actuating electrode; and wherein the driver circuit comprises:

an alternating-current (AC) voltage supply for generating a high voltage AC signal on one of the electrode and the movable portion of the associated MEMS device, an associated HVTFT having a drain electrode connected to the other of the electrode and movable portion of the MEMS structure, a source electrode coupled to a low voltage source, and a controlling gate electrode, and means for selectively generating a maximum control voltage on the controlling gate electrode of the associated HVTFT, whereby the associated HVTFT is turned on to couple the second drain to the low voltage source, wherein the maximum control voltage is substantially lower than an amplitude of the high voltage AC signal.

9. The apparatus according to claim 8, further comprising:

a first capacitor connected between the source electrode of the associated HVTFT and the low voltage source; and a second capacitor connected between the controlling gate electrode of the associated HVTFT and the low voltage source.

10. An apparatus comprising:

a substrate;

an actuated MEMS device including:

an actuating electrode formed over the substrate; and a MEMS structure including a movable portion located adjacent to the actuating electrode, wherein the MEMS structure is formed such that the movable portion is actuated into a first position relative to the substrate when the electrode generates a first electrostatic field, and the movable portion is actuated into a second position relative to the substrate when the electrode generates a second electrostatic field; and an actuating circuit mounted on the substrate for selectively applying one of a first actuating voltage to the actuated MEMS device, whereby the actuating electrode generates the first electrostatic field, and a second actuating voltage to the actuating electrode, whereby the actuating electrode generates the second electrostatic field, wherein the actuating circuit includes a high-voltage thin-film transistor (HVTFT) formed on the substrate, the HVTFT including a controlling gate electrode, a source electrode, and a drain electrode arranged such that a portion of the source electrode is separated from the controlling gate electrode by a first distance, and the drain electrode is arranged in an offset position such that the drain electrode is laterally offset from the controlling gate electrode by an offset distance that is substantially greater than the first distance.

11. The apparatus according to claim 10, wherein the substrate comprises one of glass, ceramic, plastic, stainless steel, a flexible substrate, and a semiconductor material.

12. The apparatus according to claim 10, wherein the substrate comprises an active integrated circuit including a logic control circuit coupled to the controlling gate electrode of the HVTFT.

13. The apparatus according to claim 10, wherein the drain electrode of the HVTFT is connected to the actuating electrode of the actuated MEMS device, and the source electrode of the HVTFT is connected to a low voltage source.

14. The apparatus according to claim 10, wherein the drain electrode of the HVTFT is connected to one of the anchor portion and the actuating electrode of the actuated MEMS device, and the source electrode of the HVTFT is connected to a low voltage source.

15. An apparatus comprising:

a control logic circuit for generating control signals having a maximum logic voltage;

a low voltage source;

a high voltage source for providing an actuating voltage that is substantially higher than the maximum logic voltage;

a first high voltage thin-film transistor (HVTFT) including a controlling gate electrode coupled to the control circuit, a source electrode positioned relatively close to the controlling gate electrode and coupled to the low voltage source, and a drain electrode positioned relatively far from the controlling gate electrode and coupled to the high voltage source; and an actuated MEMS device connected to the drain electrode of the first HVTFT.

16. The apparatus according to claim 15, further comprising a second HVTFT having a first controlling gate electrode and a source electrode connected to the high voltage source, and a first drain electrode connected to an intermediate node, wherein the drain electrode of the first HVTFT is connected to the intermediate node.

17. The apparatus according to claim 16, wherein the actuated MEMS device comprises:

an actuating electrode connected to the intermediate node; and a MEMS structure including an anchor portion, and a movable portion extending from the anchor portion and located adjacent to the actuating electrode, wherein the MEMS structure includes an internal stress gradient formed such that the movable portion bends away from the actuating electrode when the maximum control voltage is applied to the second controlling gate electrode.

18. The apparatus according to claim 15, wherein the actuated MEMS device comprises:

an actuating electrode, and a MEMS structure including a movable portion located adjacent to the actuating electrode, wherein the apparatus further comprises an alternating-current (AC) voltage supply for generating a high voltage AC signal on one of the movable portion and the actuating electrode of the actuated MEMS device, and wherein the drain electrode of the first HVTFT is connected to the other of the movable portion and the actuating electrode of the actuated MEMS device, and the source electrode of the first HVTFT is coupled to a low voltage source.

19. The apparatus according to claim 18, further comprising:

a first capacitor connected between the source electrode of the first HVTFT and the low voltage source; and a second capacitor connected between the controlling gate electrode of the first HVTFT and the low voltage source.

20. The apparatus according to claim 15, wherein control logic circuit, the first HVTFT, and the actuated MEMS device are integrally formed on a substrate comprising one of glass, ceramic, plastic, stainless steel, a flexible substrate, and a semiconductor material.

* * * * *